(12) United States Patent
Lee et al.

(10) Patent No.: US 12,207,467 B2
(45) Date of Patent: Jan. 21, 2025

(54) SEMICONDUCTOR DEVICE

(71) Applicant: SAMSUNG ELECTRONICS CO., LTD., Suwon-si (KR)

(72) Inventors: Bong Yong Lee, Suwon-si (KR); Tae Hun Kim, Suwon-si (KR); Min Kyung Bae, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 332 days.

(21) Appl. No.: 17/669,830

(22) Filed: Feb. 11, 2022

(65) Prior Publication Data

US 2022/0165752 A1 May 26, 2022

Related U.S. Application Data

(63) Continuation of application No. 16/701,340, filed on Dec. 3, 2019, now Pat. No. 11,257,840.

(30) Foreign Application Priority Data

Jun. 10, 2019 (KR) .................. 10-2019-0067686

(51) Int. Cl.
*H10B 43/20* (2023.01)
*H01L 23/10* (2006.01)
(Continued)

(52) U.S. Cl.
CPC ............. *H10B 43/27* (2023.02); *H01L 23/10* (2013.01); *H01L 29/0649* (2013.01);
(Continued)

(58) Field of Classification Search
CPC .................. H10B 43/27; H10B 43/20
See application file for complete search history.

(56) References Cited

U.S. PATENT DOCUMENTS 8,952,426 B2 2/2015 Maejima
9,508,730 B2 11/2016 Lee et al.
(Continued)

FOREIGN PATENT DOCUMENTS

KR 10-2018-0106963 A 10/2018
KR 10-2018-0138410 A 12/2018
WO WO-2018031094 A1 * 2/2018 ........ H01L 21/76816

OTHER PUBLICATIONS

First Office Action dated Jan. 12, 2024 issued by the Korean Intellectual Property Office for corresponding patent application KR 10-2019-0067686.

*Primary Examiner* — Christopher A Johnson
(74) *Attorney, Agent, or Firm* — Muir Patent Law, PLLC

(57) ABSTRACT

A semiconductor device including a substrate; a lower structure including a sealing layer on the substrate and a support layer on the sealing layer, the sealing layer and the support layer both including a semiconductor material; a mold structure on the lower structure and having an interlayer insulating film and a conductive film alternately stacked therein; a channel hole penetrating the mold structure; a channel structure extending along sidewalls of the channel hole; an isolation trench penetrating the mold structure and extending into the lower structure; and a poly liner extending along sidewalls of the isolation trench, the poly liner being connected to the lower structure and including the semiconductor material.

8 Claims, 15 Drawing Sheets

(51) Int. Cl.
  *H01L 29/06*      (2006.01)
  *H10B 41/27*      (2023.01)
  *H10B 41/40*      (2023.01)
  *H10B 43/27*      (2023.01)
  *H10B 43/40*      (2023.01)

(52) U.S. Cl.
  CPC .............. *H10B 41/27* (2023.02); *H10B 41/40* (2023.02); *H10B 43/40* (2023.02)

(56) References Cited

U.S. PATENT DOCUMENTS

| | | |
|---|---|---|
| 9,824,966 B1 | 11/2017 | Kanakamedala et al. |
| 9,842,855 B2 | 12/2017 | Lee |
| 9,881,931 B2 | 1/2018 | Lee |
| 9,985,048 B2 | 5/2018 | Lee |
| 10,163,924 B2 | 12/2018 | Ahn |
| 2018/0374869 A1 | 12/2018 | Kim et al. |
| 2020/0295040 A1* | 9/2020 | Tobioka ............ H01L 21/31144 |
| 2020/0343258 A1* | 10/2020 | Otsu ...................... H10B 41/35 |

* cited by examiner

SEMICONDUCTOR DEVICE

CROSS-REFERENCE TO RELATED APPLICATIONS

This is a continuation application based on pending application Ser. No. 16/701,340, filed Dec. 3, 2019, the entire contents of which is hereby incorporated by reference.

Korean Patent Application No. 10-2019-0067686, filed on Jun. 10, 2019, in the Korean Intellectual Property Office, and entitled: "Semiconductor Device and Method of Fabricating the Same," is incorporated by reference herein in its entirety.

BACKGROUND

1. Field

Embodiments relate to a semiconductor device and a method of manufacturing the same.

2. Description of the Related Art

Semiconductor memory devices are memory devices using a semiconductor such as silicon (Si), germanium (Ge), gallium arsenide (GaAs), indium phosphide (InP), or the like. The semiconductor memory devices may be largely classified into a volatile memory device and a nonvolatile memory device.

The volatile memory device is a memory device that loses stored data when the supply of power is interrupted. Examples of the volatile memory device include a static random-access memory (SRAM), a dynamic random-access memory (DRAM), a synchronous DRAM, and the like. The nonvolatile memory device is a memory device which can retain its data even when the supply of power is interrupted. Examples of the nonvolatile memory device include a read-only memory (ROM), a programmable ROM, an electrically programmable ROM (EPROM), an electrically erasable programmable ROM (EEPROM), a resistive memory device (e.g., a phase-change random-access memory (PRAM), a ferroelectric random-access memory (FRAM), or a resistive random-access memory (RRAM)), and the like.

SUMMARY

The embodiments may be realized by providing a semiconductor device including a substrate; a lower structure including a sealing layer on the substrate and a support layer on the sealing layer, the sealing layer and the support layer both including a semiconductor material; a mold structure on the lower structure and having an interlayer insulating film and a conductive film alternately stacked therein; a channel hole penetrating the mold structure; a channel structure extending along sidewalls of the channel hole; an isolation trench penetrating the mold structure and extending into the lower structure; and a poly liner extending along sidewalls of the isolation trench, the poly liner being connected to the lower structure and including the semiconductor material.

The embodiments may be realized by providing a semiconductor device including a substrate; a lower structure including a sealing layer on the substrate and a support layer on the sealing layer, the sealing layer and the support layer each including a semiconductor material; a mold structure on the lower structure, the mold structure having an interlayer insulating film and a conductive film alternately stacked therein; a first isolation trench penetrating the mold structure and extending into the lower structure; a second isolation trench penetrating the mold structure and extending into the substrate; and a first poly liner and a second poly liner extending along sidewalls of the first isolation trench and the second isolation trench, respectively, the first poly liner and the second poly liner each including the semiconductor material; a channel hole penetrating the mold structure between the first isolation trench and the second isolation trench; and a semiconductor pattern extending along sidewalls of the channel hole, wherein the second poly liner is connected to the lower structure.

The embodiments may be realized by providing a semiconductor device including a substrate; a lower structure including a sealing layer on the substrate and a support layer on the sealing layer, the sealing layer and the support layer each including a semiconductor material; a mold structure on the lower structure, the mold structure having an interlayer insulating film and a conductive film alternately stacked therein; a first isolation trench penetrating the mold structure; a second isolation trench penetrating the mold structure; a first poly liner and a second poly liner extending along sidewalls of the first isolation trench and the second isolation trench, respectively, the first poly liner and the second poly liner including the semiconductor material; a channel hole penetrating the mold structure between the first isolation trench and the second isolation trench; and a semiconductor pattern extending along sidewalls of the channel hole, wherein a bottom surface of the first poly liner is located in the substrate, and a bottom surface of the second poly liner is located in the lower structure.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
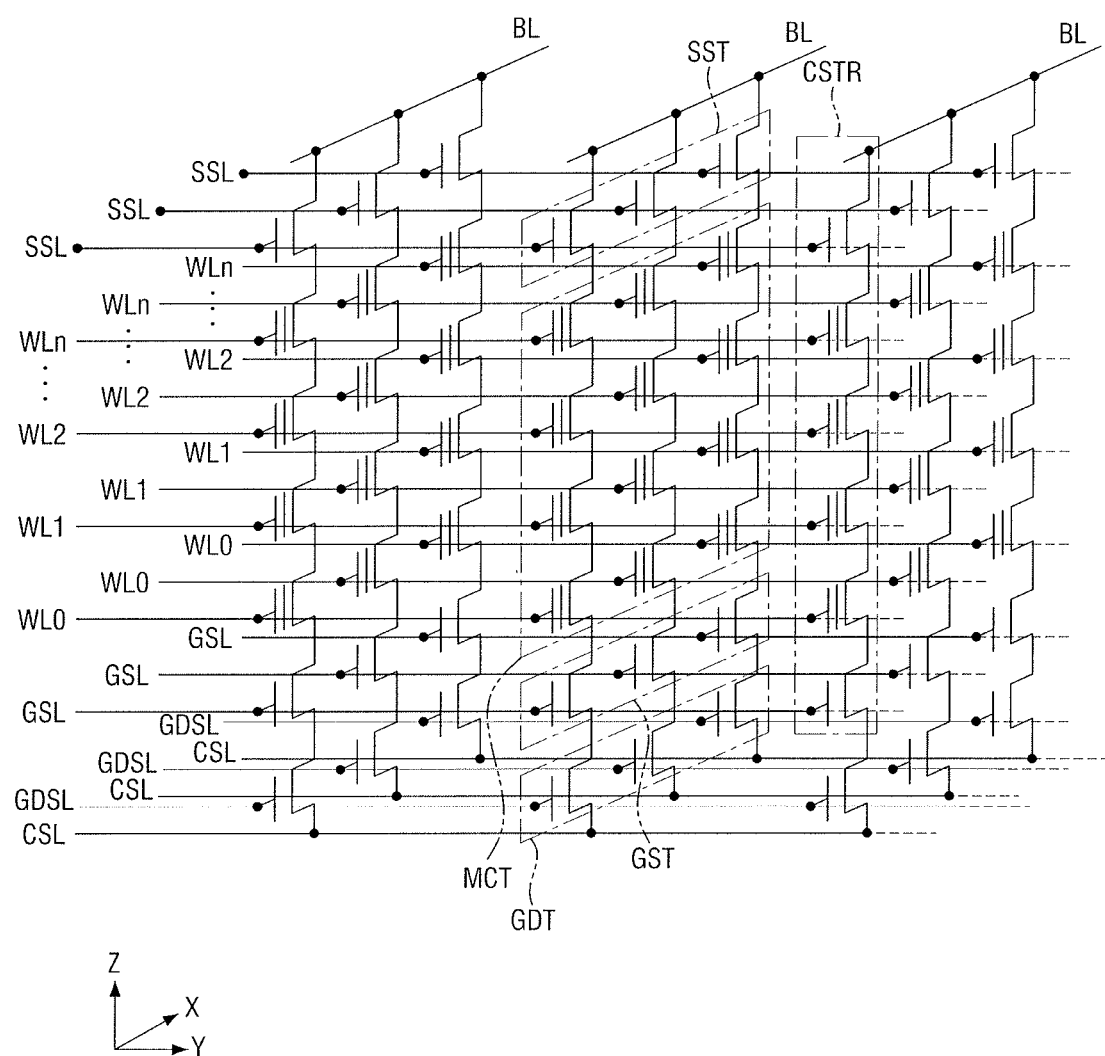
FIG. 1 illustrates a circuit diagram of a semiconductor device according to some embodiments of the present disclosure.

FIG. 1 illustrates a circuit diagram of a semiconductor device according to some embodiments of the present disclosure.

Referring to FIG. 1, the semiconductor device may include a plurality of common source lines CSL, a plurality of bit lines BL, a plurality of cell strings CSTR, ground selection transistors GST, and gate induced drain leakage (GIDL) transistors GDT.

The bit lines BL may be arranged two-dimensionally. For example, the bit lines BL may be spaced apart from one another and may extend (e.g., lengthwise) in a first direction X. A plurality of cell strings CSTR may be connected in parallel to each of the bit lines BL. The cell strings CSTR may be connected to the common source lines CSL. For example, the cell strings CSTR may be between the bit lines Bl and the common source lines CSL.

In an implementation, the common source lines CSL may be arranged two-dimensionally. For example, the common source lines CSL may be spaced apart from one another and may extend (e.g., lengthwise) in a second direction Y. The same voltage may be applied to the common source lines CSL, or different voltages may be applied to the common source lines CSL and may be controlled separately.

Each of the cell strings CSTR may include a GIDL transistor GDT which is connected to one of the common source lines CSL, a string selection transistor SST which is connected to one of the bit lines BL, a ground selection transistor GST which is connected to the GIDL transistor GDT, and a plurality of memory cell transistors MCT which are between the ground selection transistor GST and the string selection transistor SST. Each of the memory cell transistors MCT may include a data storage element. The GIDL transistor GDT, the ground selection transistor GST, the string selection transistor SST, and the memory cell transistors MCT may be connected to one another in series.

The common source lines CSL may be connected in common to the sources of the GIDL transistors GDT. GIDL selection lines GDSL, ground selection lines GSL, a plurality of word lines WL0 through WLn, and string selection lines SSL may be disposed between the common source lines GSL and the bit lines BL. The GIDL selection lines GDSL may be connected to the gate electrodes of the GIDL transistors GDT to turn on or off the GIDL transistors GDT, the ground selection lines GSL may be connected to the gate electrodes of the ground selection transistors GST to turn on or off the ground selection transistors GST, the word lines WL0 through WLn may be connected to the gate electrodes of the memory cell transistors MCT to turn on or off the memory cell transistors MCT, and the string selection lines SSL may be connected to the gate electrodes of the string selection transistors SST to turn on or off the string selection transistors SST.

Figure 2:
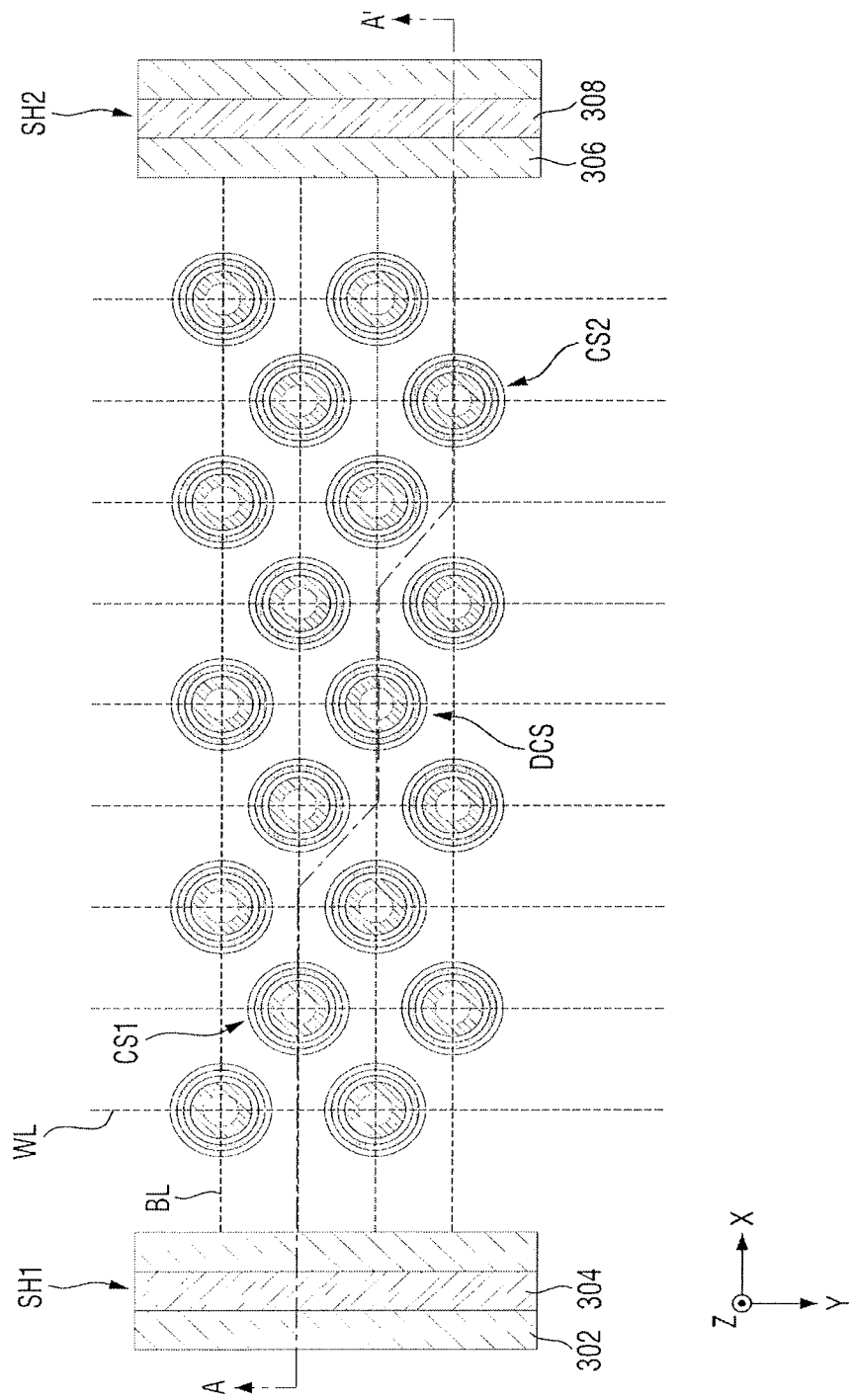
FIG. 2 illustrates a layout view of a semiconductor device according to some embodiments of the present disclosure.
Figure 3:
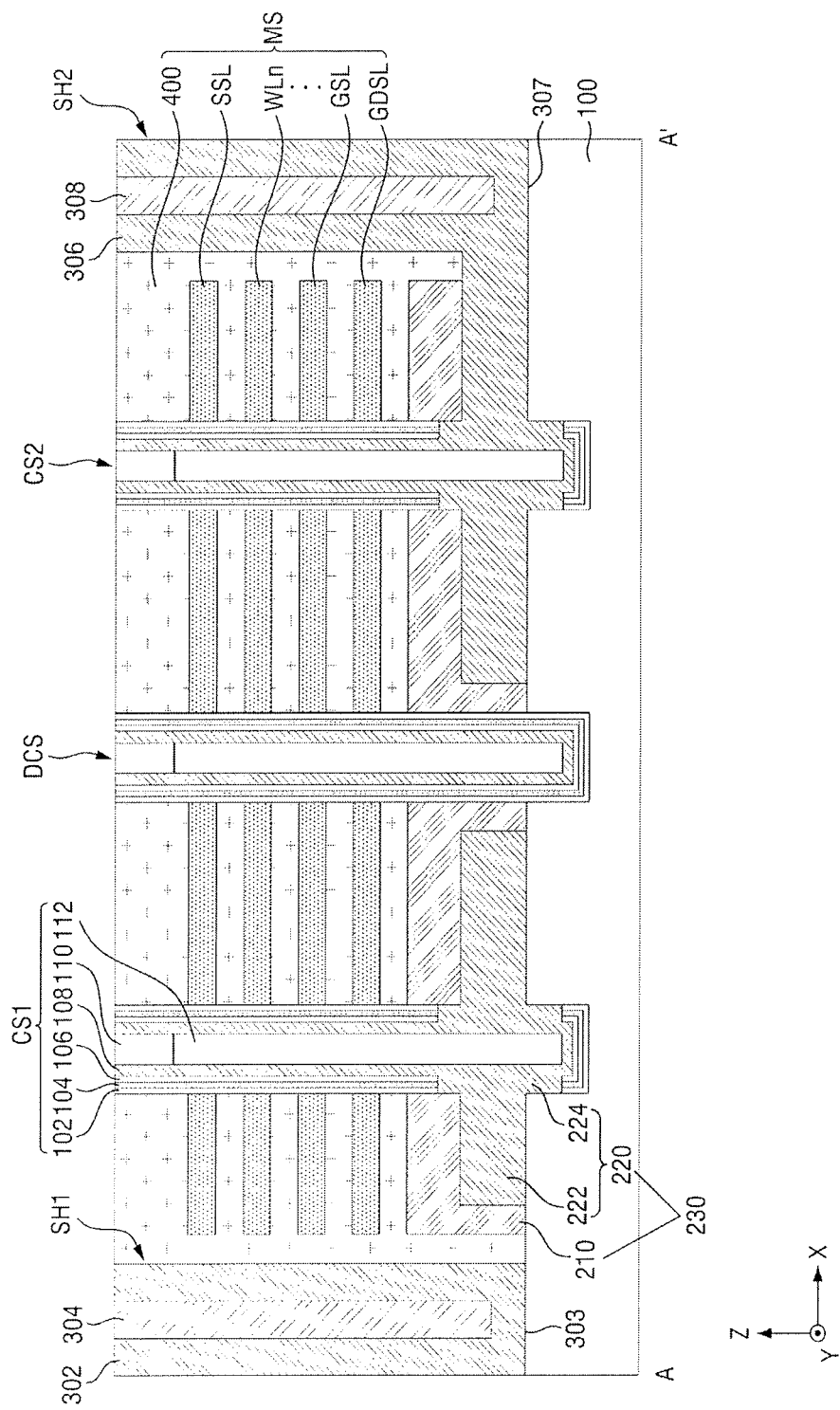
FIG. 3 illustrates a cross-sectional view taken along line A-A' of FIG. 2.

FIG. 2 illustrates a layout view of a semiconductor device according to some embodiments of the present disclosure. FIG. 3 illustrates a cross-sectional view taken along line A-A' of FIG. 2.

Referring to FIGS. 2 and 3, the semiconductor device may include a substrate 100, a first channel structure CS1, a second channel structure CS2, a dummy channel structure DCS, a first isolation trench SH1, a second isolation trench SH2, and a lower structure 230. The first and second channel structures CS1 and CS2 may be collectively referred to as the channel structures (CS1 and CS2), and the first and second isolation trenches SH1 and SH2 may be collectively referred to as the isolation trenches (SH1 and SH2).

The substrate 100 may include a semiconductor substrate, e.g., a Si substrate, a Ge substrate, or a Si—Ge substrate. As used herein, the term "or" is not an exclusive term, e.g., "A or B" would include A, B, or A and B. In an implementation, the substrate 100 may include a silicon-on-insulator (SOI) substrate or a germanium-on-insulator (GOI) substrate.

A mold structure MS may include conductive films (GDSL, GSL, WL0 through WLn, and SSL) and an interlayer insulating film 400. The conductive films (GDSL, GSL, WL0 through WLn, and SSL) and the interlayer insulating film 400 may extend in the first direction X which is parallel to the top surface of the substrate 100.

The conductive films (GDSL, GSL, WL0 through WLn, and SSL) and the interlayer insulating film 400 may be alternately stacked in a third direction Z which is perpendicular to the top surface of the substrate 100. For example, the conductive films (GDSL, GSL, WL0 through WLn, and SSL) may be sequentially stacked on the substrate 100 along the third direction Z to be spaced apart from one another, and the interlayer insulating film 400 may be between the conductive films (GDSL, GSL, WL0 through WLn, and SSL) and between the conductive films (GDSL, GSL, WL0 through WLn, and SSL) and the lower structure 230. For example, as illustrated in FIG. 3, the mold structure MS may include the interlayer insulating film 400 and the conductive films (GDSL, GSL, WL0 through WLn, and SSL) which are stacked on the substrate 100.

The interlayer insulating film 400 may be stacked between the conductive films (GDSL, GSL, WL0 through WLn, and SSL) and may be formed along the sidewalls of each of the isolation trenches (SH1 and SH2) and between the isolation trenches (SH1 and SH2) and a support layer 210.

In an implementation, the conductive films (GDSL, GSL, WL0 through WLn, and SSL) may have the same thickness. In an implementation, the conductive films (GDSL, GSL, WL0 through WLn, and SSL) may have different thicknesses.

In an implementation, a lowermost (e.g., closest to the substrate 100 in the third direction Z) conductive film of the conductive films (GDSL, GSL, WL0 through WLn, and SSL) may be the GIDL selection lines GDSL of FIG. 1. In an implementation, an uppermost (e.g., farthest from the substrate 100 in the third direction Z) conductive film of the conductive films (GDSL, GSL, WL0 through WLn, and SSL) may be the string selection lines SSL of FIG. 1. In an implementation, the intermediate conductive films between the lowermost and uppermost conductive films of the conductive films (GDSL, GSL, WL0 through WLn, and SSL) may be the ground selection lines GSL and/or the word lines WO0 through WLn of FIG. 1.

The conductive films (GDSL, GSL, WL0 through WLn, and SSL) may include a conductive material. In an implementation, the conductive films (GDSL, GSL, WL0 through WLn, and SSL) may include, e.g., a metal such as tungsten (W), cobalt (Co), or nickel (Ni) or a semiconductor material such as Si.

The interlayer insulating film 400 may include an insulating material. In an implementation, the interlayer insulating film 400 may include, e.g., a silicon oxide such as borosilicate glass (BSG), phosphosilicate glass (PSG), borophosphosilicate glass (BPSG), undoped silicate glass (USG), tetraethylorthosilicate glass (TEOS), or high-density plasma chemical vapor deposition (HDP-CVD) silicon oxide.

The channel structures (CS1 and CS2) and the dummy structure DCS may be formed along the sidewalls of each channel hole extending in the third direction Z, to penetrate the mold structure MS. For example, the channel structures (CS1 and CS2) and the dummy structure DCS may penetrate the conductive films (GDSL, GSL, WL0 through WLn, and SSL) and the interlayer insulating film 400 on the substrate 100. In an implementation, the channel structures (CS1 and CS2) and the dummy structure DCS may be formed as, e.g., pillars. For example, the conductive films (GDSL, GSL, WL0 through WLn, and SSL) may intersect the channel structures (CS1 and CS2) and the dummy structure DCS.

Multiple first channel structures CS1, multiple second channel structures CS2, and multiple dummy structures DCS may be formed. For example, as illustrated in FIG. 2, the multiple first channel structures CS1, the multiple second channel structures CS2, and the multiple dummy structures DCS may be arranged in a second direction Y and in the third direction Z. The channel structures (CS1 and CS2) and the dummy structure DCS may be between the first and second isolation trenches SH1 and SH2.

The channel structures (CS1 and CS2) and the dummy structure DCS may include semiconductor patterns 108. The semiconductor patterns 108 may be connected to the substrate 100 through the mold structure MS. For example, the semiconductor patterns 108 may extend in the third direction Z. In an implementation, the semiconductor patterns 108 may be formed in the shape of, e.g., cups. For example, the channel structures (CS1 and CS2) and the dummy structure DCS may include filling insulating patterns 112 and the semiconductor patterns 108, which extend conformally along the bottom surfaces and the sidewalls of the respective filling insulating patterns 112. In an implementation, the filling insulating patterns 112 may include, e.g., a silicon oxide. In an implementation, the semiconductor patterns 108 may be formed in various other shapes, e.g., the shape of cylinders, rectangular containers, or non-hollow pillars.

In an implementation, the semiconductor patterns 108 may be formed of, e.g., polysilicon. The semiconductor patterns 108 may completely fill the channel structures (CS1 and CS2) and the dummy structure DCS. In an implementation, the filling insulating patterns 112 may not be formed. In an implementation, the semiconductor patterns 108 may be formed along the surfaces of the filling insulating patterns 112 not to fill the channel structures (CS1 and CS2) and the dummy structure DCS.

A capping film 110 may be formed on the channel structures (CS1 and CS2) and the dummy structure DCS. For example, the capping film 110 may be on the filing insulating patterns 112. In an implementation, as illustrated in the drawings, the top surface of the capping film 110 may be on the same plane as the top surfaces of the semiconductor patterns 108. In an implementation, the top surfaces of the semiconductor patterns 108 may be on the same plane as the top surfaces of the filling insulating patterns 112. In an implementation, the capping film 110 may be on the top surfaces of the filling insulating patterns 112 and on the top surfaces of the semiconductor patterns 108.

The capping film 110 may be formed of the same material as the semiconductor patterns 108. In an implementation, the capping film 110 may be formed of, e.g., polysilicon.

A tunnel insulating film 106 may be formed along the sidewalls of each of the channel structures (CS1 and CS2) and the dummy structure (DCS). For example, the tunnel insulating film 106 may be formed to partially surround the sidewalls of each of the semiconductor patterns 108. The tunnel insulating film 106 may extend in the third direction Z.

The tunnel insulating film 106 may include, e.g., silicon oxide or silicon oxynitride. In an implementation, the tunnel insulating film 106 may be formed as a double layer including a silicon oxide film and a silicon nitride film. For convenience, the tunnel insulating film 106 will hereinafter be described as including a silicon oxide.

A charge storage film 104 may be formed on the tunnel insulating films 106. For example, the tunnel insulating film 106 may be between the semiconductor patterns 108 and the charge storage film 104. The charge storage film 104 may extend in the third direction Z.

Charges that tunnel through the tunnel insulating film 106 from the semiconductor patterns 108 may be stored in the charge storage film 104. The charges stored in the charge storage film 104 may be changed by, e.g., Fowler-Nordheim tunneling caused by the difference in voltage between the semiconductor patterns 108 and the conductive films (GDSL, GSL, WL0 through WLn, and SSL).

The charge storage film 104 may include, e.g., silicon nitride, silicon oxynitride, silicon-rich nitride, or nanocrystalline silicon. For convenience, the charge storage film 104 will hereinafter be described as including silicon nitride.

A blocking insulating film 102 may be on the charge storage film 104. For example, the charge storage film 104 may be between the tunnel insulating film 106 and the blocking insulating film 102.

In an implementation, the blocking insulating film 102 may be, e.g., between the charge storage film 104 and the conductive films (GDSL, GSL, WL0 through WLn, and SSL). In an implementation, the blocking insulating film 102 may, e.g., surround the conductive films (GDSL, GSL, WL0 through WLn, and SSL).

The blocking insulating film 102 may include, e.g., silicon oxide or a high-k material having a greater permittivity constant than silicon oxide. The high-k material may include, e.g., aluminum oxide, hafnium oxide, lanthanum oxide, tantalum oxide, titanium oxide, lanthanum hafnium oxide, lanthanum aluminum oxide, dysprosium scandium oxide, or a combination thereof. For convenience, the blocking insulating film 102 will hereinafter be described as including silicon oxide.

The lower structure 230 may be below (e.g., closer to the substrate 100 in the third direction Z than) the mold structure MS. The lower structure 230 may include the support layer 210 and a sealing layer 220. The sealing layer 220 may include a butting layer 224 in the channel structures (CS1 and CS2) and a sub-butting layer 222 on an outside of each of the channel structures (CS1 and CS2).

The support layer 210 and the sealing layer 220 may be formed of the same material as the semiconductor patterns 108. In an implementation, the support layer 210 and the sealing layer 220 may be formed of, e.g., polysilicon. In an implementation, the support layer 210 and the sealing layer 220 may include, e.g., the same material.

The support layer 210 may help prevent the semiconductor device from collapsing, e.g., as the semiconductor device becomes higher in the third direction Z.

The sealing layer 220 may transmit a current to, or receive a current from, the second isolation trench SH2 (e.g., structures in the second isolation trench SH2), which serves as a common source line, through low resistance and through the butting layer 224, which is in the channel structures (CS1 and CS2), and the sub-butting layer 222, which is connected to the butting layer 224. The sealing layer 220 may be formed through the formation of the sidewall profile of the second isolation trench SH2, and any defects that may be generated, e.g., in the substrate 100, when etching the sealing layer 220 can be reduced.

The isolation trenches (SH1 and SH2) (e.g., structures in the isolation trenches SH1 and SH2) may be connected to the substrate 100 through the mold structure MS. For example, the first isolation trench SH1 may isolate channel structures that are adjacent to one another. For example, the second isolation trench SH2 may be or may accommodate a common source line GSL.

In an implementation, a first poly liner 302 may be on sidewalls of the first isolation trench SH1, and a second poly liner 306 may be on sidewalls of the second isolation trench SH2. A first sub-poly liner 304 may fill an inside (e.g., remaining parts) of the first isolation trench SH1, and a second sub-poly liner 308 may fill an inside (e.g., remaining parts) of the second isolation trench SH2.

In an implementation, the first and second poly liners 302 and 306 may include the same material, e.g., polysilicon. In an implementation, the first and second sub-poly liners 304 and 308 may include the same material, e.g., polysilicon. In an implementation, the first poly liner 302 and the first sub-poly liner 304 may include the same material. In an implementation, the second poly liner 306 and the second sub-poly liner 308 may include the same material. The first and second poly liners 302 and 306 may be collectively referred to as the poly liners (302 and 306), and the first and second sub-poly liners 304 and 308 may be collectively referred to as the sub-poly liners (302 and 306).

The second poly liner 306 may extend along the sidewalls of the second isolation trench SH2 and may be connected to the sealing layer 220 of the lower structure 230 below the second channel structure CS2. For example, a bottom surface 303 of the first poly liner 302 may be in contact with the substrate 100, and a bottom surface 307 of the second poly liner 306 may be in the lower structure 230 so that the second poly liner 306 may be connected to the lower structure 230.

For example, the sealing layer 220 may transmit a current to, or receive a current from, the second poly liner 306 of the second isolation trench SH2 through the butting layer 224, which is formed on the inside of the second channel structure CS2, and the sub-butting layer 222, which is connected to the butting layer 224, and through low resistance. The sealing layer 220 may be formed through the formation of the second poly liner 306, which forms the sidewall profile of the second isolation trench SH2, and any defects that may be generated, e.g., in the substrate 100, when etching the sealing layer 220, may be reduced.

In an implementation, a high-concentration doped region including part of the bottom surface 307 of the second poly liner 306 of the second isolation trench SH2 may be in the substrate 100.

Figure 4:
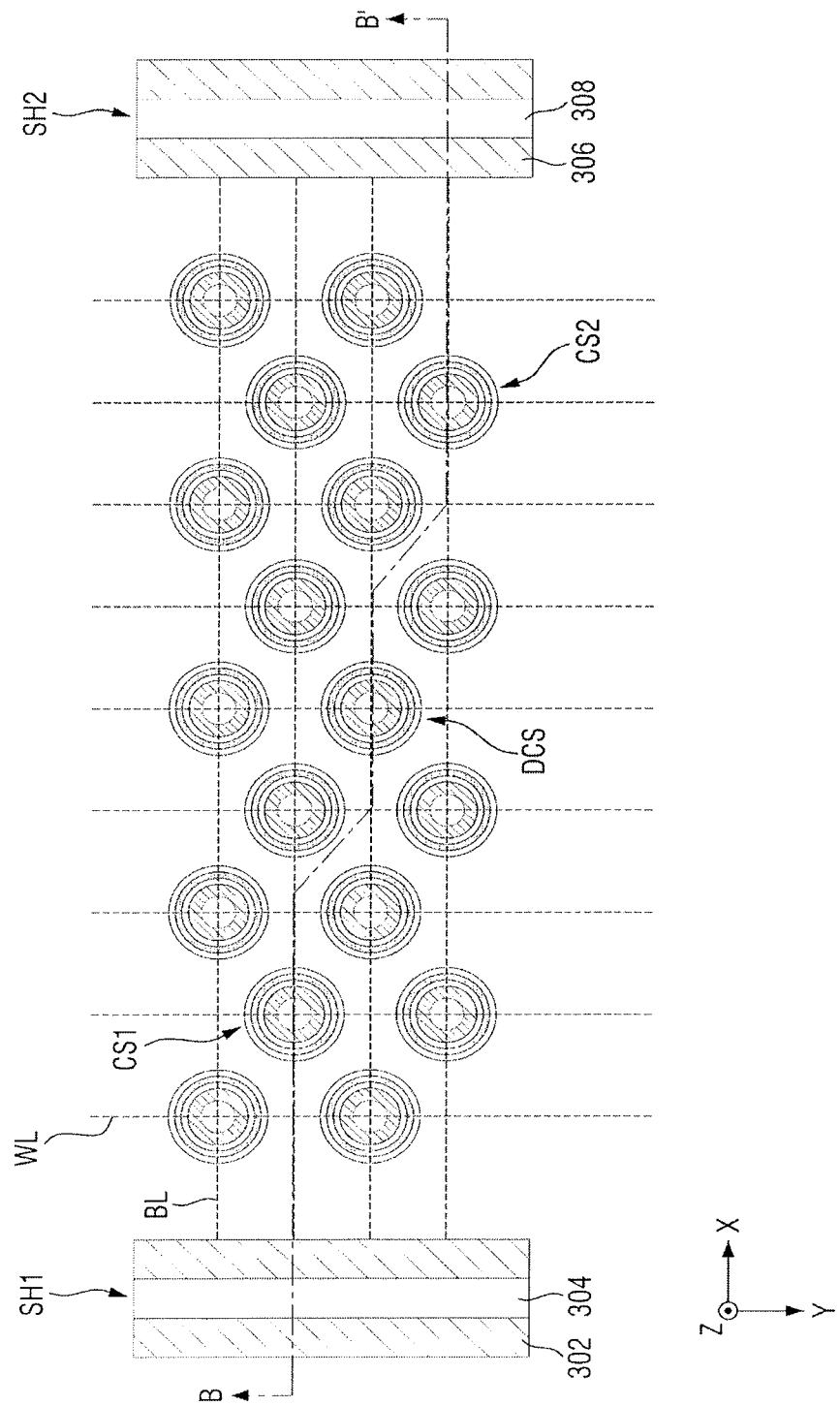
FIG. 4 illustrates a layout view of a semiconductor device according to some embodiments of the present disclosure.
Figure 5:
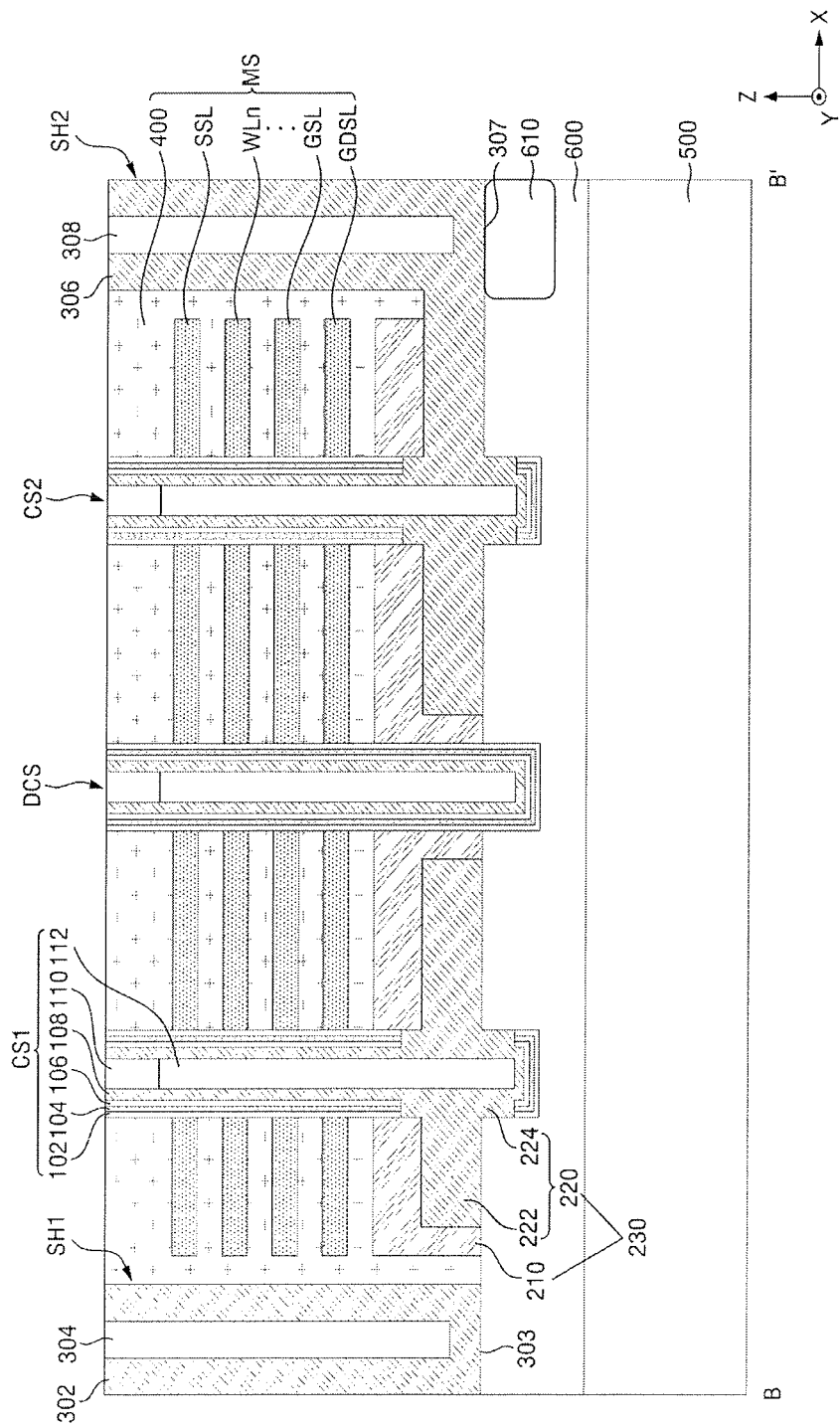
FIG. 5 illustrates a cross-sectional view taken along line B-B' of FIG. 4.

FIG. 4 illustrates a layout view of a semiconductor device according to some embodiments of the present disclosure. FIG. 5 illustrates a cross-sectional view taken along line B-B' of FIG. 4. The semiconductor device of FIGS. 4 and 5 will hereinafter be described, focusing mainly on the differences with the semiconductor device of FIGS. 2 and 3.

Referring to FIGS. 4 and 5, an electrode substrate 600 (which serves as a common source) may be formed on a bottom surface 303 of a first isolation trench SH1, a bottom surface 307 of a second isolation trench SH2, the bottom surfaces of channel structures (CS1 and CS2), the bottom surface of a dummy structure DCS, the bottom surface of a lower structure 230, and the bottom surface of an interlayer insulating film 400.

A high-concentration doped region 610 (which includes part of the bottom surface 307 of the second poly liner 306 of the second isolation trench SH2) may be in the electrode substrate 600. For example, the isolation trenches (SH1 and SH2) may be floated.

A peripheral circuit region 500 (in which peripheral circuits are disposed) may be formed at the bottom of the electrode substrate 600. The peripheral circuits may include logic circuits which select and control cells in which to store data. In an implementation, the peripheral circuits may include, e.g., a row decoder, a column decoder, a sense amplifier, and a control circuit.

First and second sub-poly liners 304 and 308 may include an insulating material. In an implementation, the first and second sub-poly liners 304 and 308 may include the same material.

FIGS. 6 through 15 illustrate cross-sectional views of stages in a method of fabricating the semiconductor device of FIG. 3 according to some embodiments of the present disclosure. The semiconductor device of FIG. 5 is almost the same as the semiconductor device of FIG. 3 except that it includes the peripheral circuit region 500 and the electrode substrate 600, instead of the substrate 100, and thus, it will hereinafter be described how to fabricate only the semiconductor device of FIG. 3. The descriptions of the aforementioned materials used to fabricate the semiconductor device of FIG. 3 will be omitted.

Figure 6:
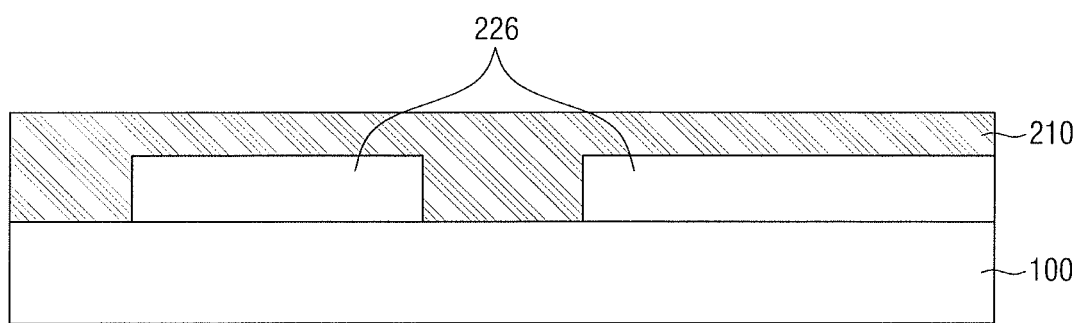
FIGS. 6 through 15 illustrate cross-sectional views of stages in a method of fabricating the semiconductor device of FIG. 3 according to some embodiments of the present disclosure.
Figure 6:
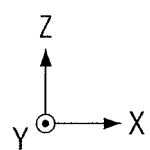

Referring to FIG. 6, a sealing layer sacrificial film 226 may be formed on a substrate 100. The substrate 100 may be a silicon substrate. A support layer 210 may be formed on the sealing layer sacrificial film 226 after removing portions of the sealing layer sacrificial film 226 from the substrate 100.

Figure 7:
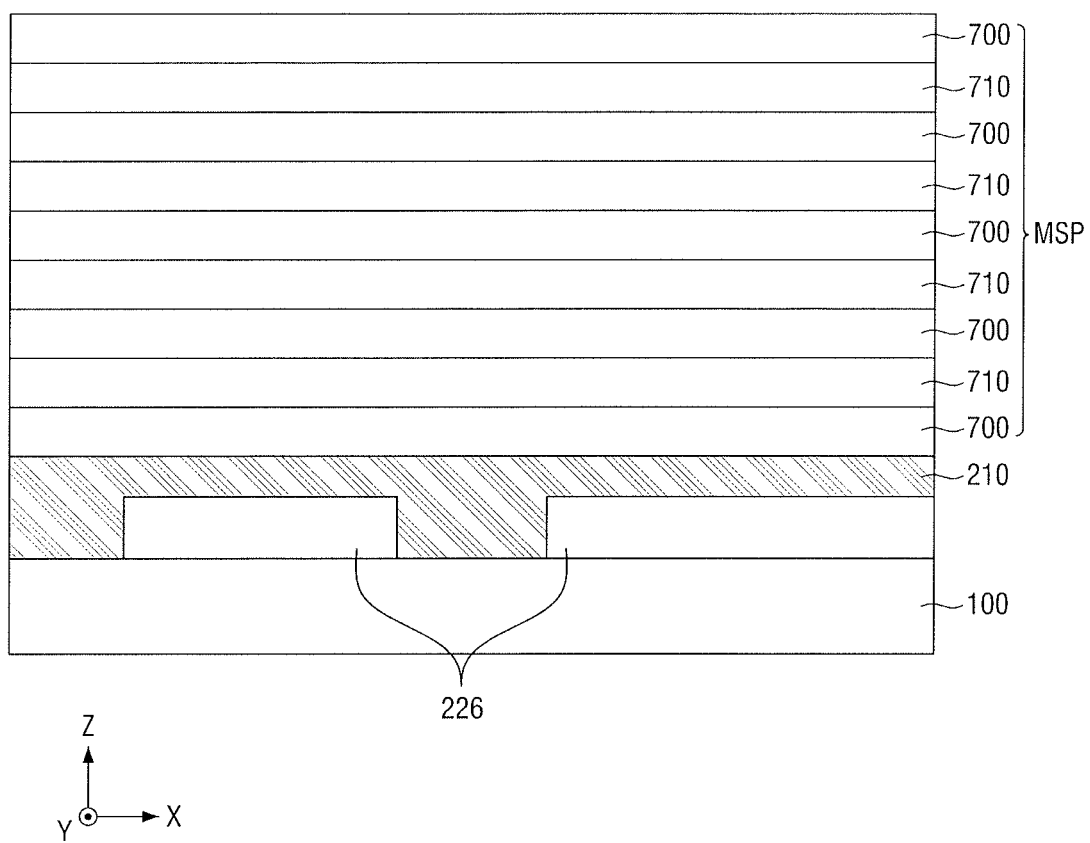

Referring to FIG. 7, a preliminary mold structure MSP (which includes first sacrificial films 700 and second sacrificial films 710) may be formed on the support layer 210.

In an implementation, the first sacrificial films 700 and the second sacrificial films 710 may be alternately stacked. For example, the first sacrificial films 700 and the second sacrificial films 710 may be sequentially and alternately stacked on the sealing layer sacrificial film 226 and the support layer 210, which are sequentially stacked on the substrate 100, to form the preliminary mold structure MSP.

In an implementation, as illustrated in the drawings, the first sacrificial films 700 and the second sacrificial films 710 may have the same thickness. In an implementation, the lowermost first sacrificial film 700 may have a different thickness from the other first sacrificial films 700, or the second sacrificial films 710 may have different thicknesses. The first sacrificial films 700 may include e.g., silicon nitride, silicon oxynitride, silicon-rich nitride, or nanocrystalline silicon. For convenience, the first sacrificial films 310 will hereinafter be described as including silicon nitride.

The second sacrificial films 710 may define regions where conductive films (GDSL, GSL, WL0 through WLn, and SSL) are to be formed. In an implementation, the second sacrificial films 710 may include, e.g., polysilicon.

Figure 8:
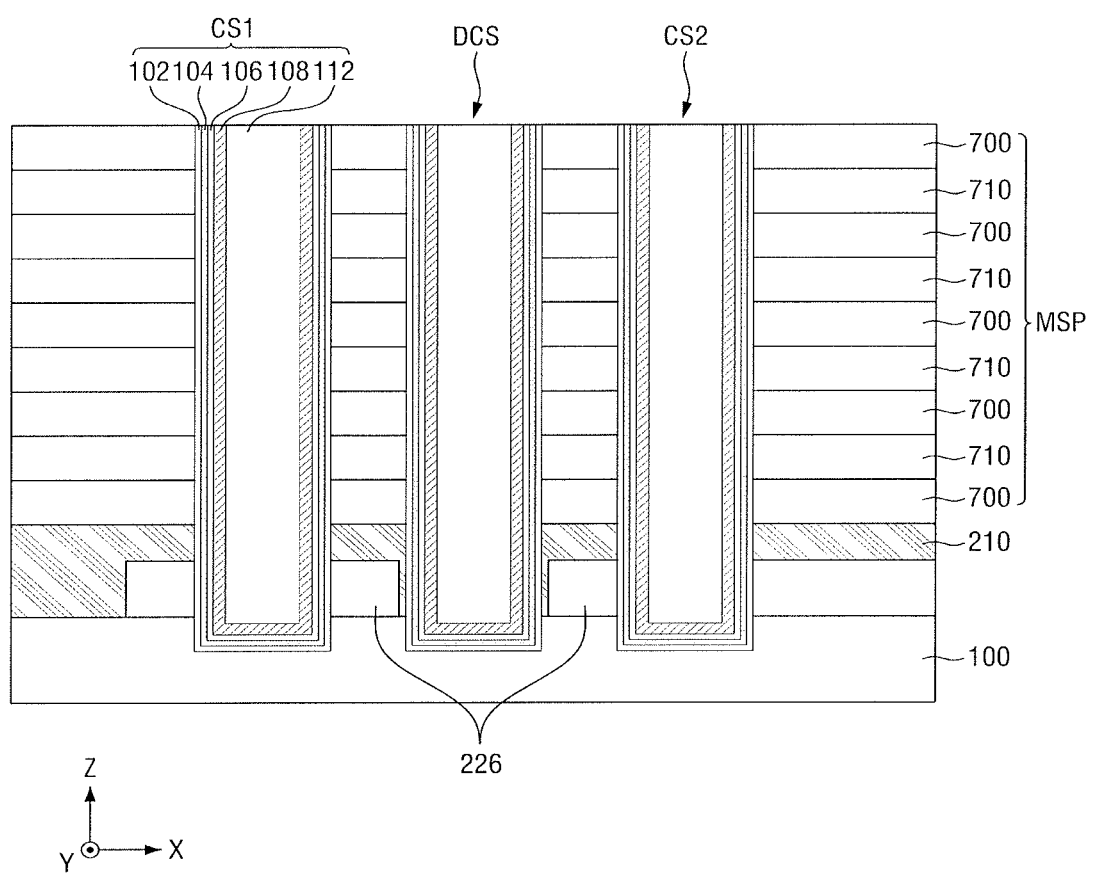

Referring to FIG. 8, channel holes and dummy holes (which expose the substrate 100) may be formed by removing portions of the preliminary mold structure MSP. For convenience, the channel holes and the dummy holes are not illustrated.

Thereafter, a blocking insulating film 102, a charge storage film 104, a tunnel insulating film 106, semiconductor patterns 108, and filling insulating patterns 112 may be formed in the channel holes and the dummy holes to cover the sidewalls and the bottom of each of the channel holes and of each of the dummy holes. The blocking insulating film 102, the charge storage film 104, the tunnel insulating film 106, the semiconductor patterns 108, and the filling insulating patterns 112 may be formed by, e.g., chemical vapor deposition (CVD) or atomic layer deposition (ALD).

In an implementation, the semiconductor patterns 108 may be formed in the shape of, e.g., cups. For example, channel structures (CS1 and CS2) and a dummy structure DCS may include the filling insulating patterns 112 and the semiconductor patterns 108, which extend conformally along the bottoms and the sidewalls of the respective filling insulating patterns 112. In an implementation, the filling insulating patterns 112 may include, e.g., silicon oxide. In an implementation, the semiconductor patterns 108 may be formed in various other shapes, e.g., the shape of cylinders, rectangular containers, or non-hollow pillars.

First and second channel structures CS1 and CS2 may be formed by depositing the blocking insulating film 102, the charge storage film 104, the tunnel insulating film 106, the semiconductor patterns 108, and the filing insulating patterns 112 in the channel holes, and the dummy structure DCS may be formed by depositing the blocking insulating film 102, the charge storage film 104, the tunnel insulating film 106, the semiconductor patterns 108, and the filing insulating patterns 112 in the dummy holes.

In an implementation, the semiconductor patterns 108 may be formed of, e.g., polysilicon. The semiconductor patterns 108 may completely fill the channel structures (CS1 and CS2) and the dummy structure DCS. In an implementation, the filling insulating patterns 112 may not be provided. In an implementation, the semiconductor patterns 108 may be formed along the surfaces of the filing insulating patterns 112 not to fill the channel structures (CS1 and CS2) and the dummy structure DCS.

The blocking insulating film 102 may include, e.g., silicon oxide or a high-k material having a greater permittivity constant than silicon oxide. The high-k material may include, e.g., aluminum oxide, hafnium oxide, lanthanum oxide, tantalum oxide, titanium oxide, lanthanum hafnium oxide, lanthanum aluminum oxide, dysprosium scandium oxide, or a combination thereof.

The charge storage film 104 may include, e.g., silicon nitride, silicon oxynitride, silicon-rich nitride, or nanocrystalline silicon.

The tunnel insulating film 106 may include, e.g., silicon oxide or silicon oxynitride. In an implementation, the tunnel insulating film 106 may be formed as a double layer including a silicon oxide film and a silicon nitride film.

Figure 9:
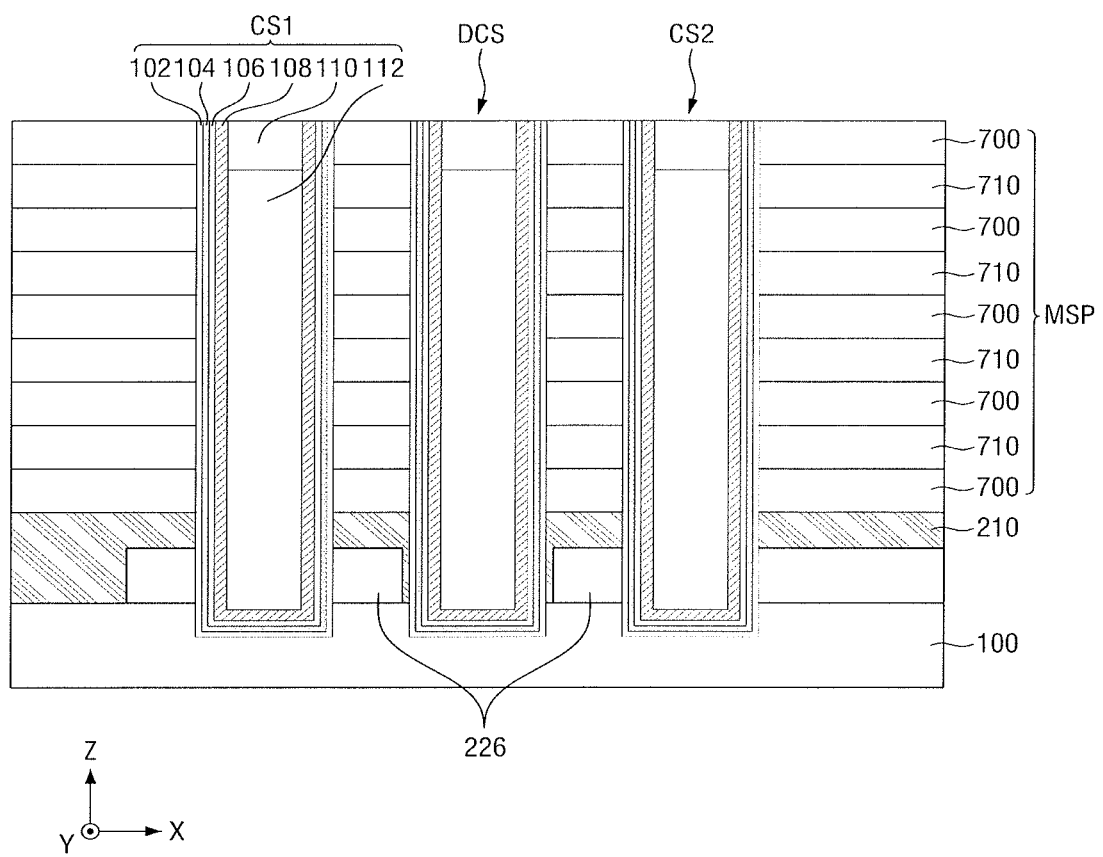

Referring to FIG. 9, a capping film 110 may be formed on the filling insulating patterns 112. In an implementation, as illustrated in FIG. 9, a top surface of the capping film 110 may be on the same plane as the top surfaces of the semiconductor patterns 108. In an implementation, the top surfaces of the semiconductor patterns 108 may be on the same plane as the top surfaces of the filling insulating patterns 112. In an implementation, the capping film 110 may be formed on the top surfaces of the filling insulating patterns 112 and on the top surfaces of the semiconductor patterns 108.

Figure 10:
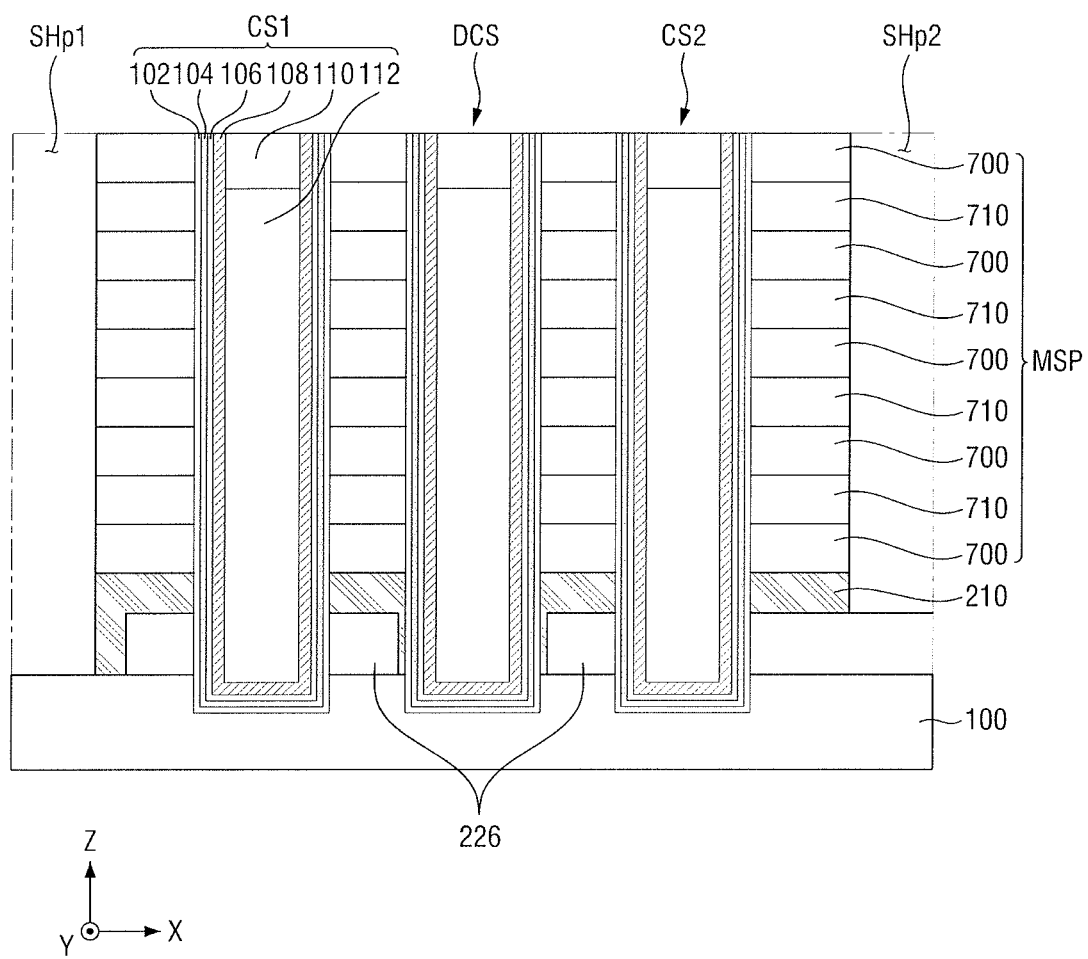

Thereafter, referring to FIG. 10, a first preliminary isolation hole SHp1 may be formed by removing part of the preliminary mold structure MSP adjacent to the first channel structure CS1 to expose the top surface of the substrate 100. Also, a second preliminary isolation hole SHp2 may be formed by removing part of the preliminary mold structure MSP adjacent to the second channel structure CS2 to expose the sealing layer sacrificial film 226.

Figure 11:
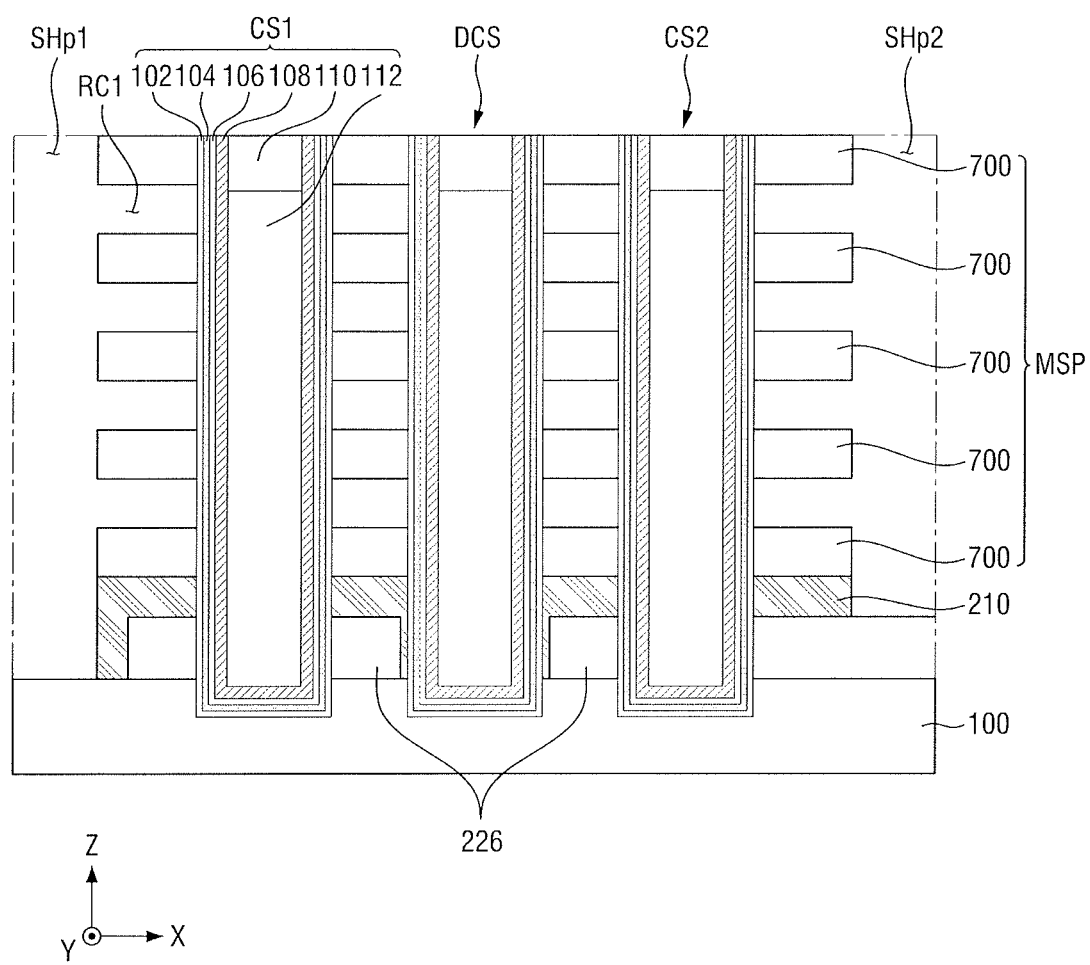

Thereafter, referring to FIG. 11, the second sacrificial films 710 may be removed. The second sacrificial films 710 may be removed using the first and second preliminary isolation holes SHp1 and SHp2 and using a pullback process. First recesses RC1 may be formed in regions where the second sacrificial films 710 have been removed. For example, the second sacrificial films 710 may include a material having etching selectivity with respect to the first sacrificial films 700. The blocking insulating film 102 may be partially removed when removing the second sacrificial films 710. For example, in order to compensate for any reduction in the thickness of the blocking insulating film 102, portions of the blocking insulating film 102 exposed between the first sacrificial films 700 after the removal of the second sacrificial films 710 may be removed, and a deposition process may be performed using the same material as that of the blocking insulating film 102.

Figure 12:
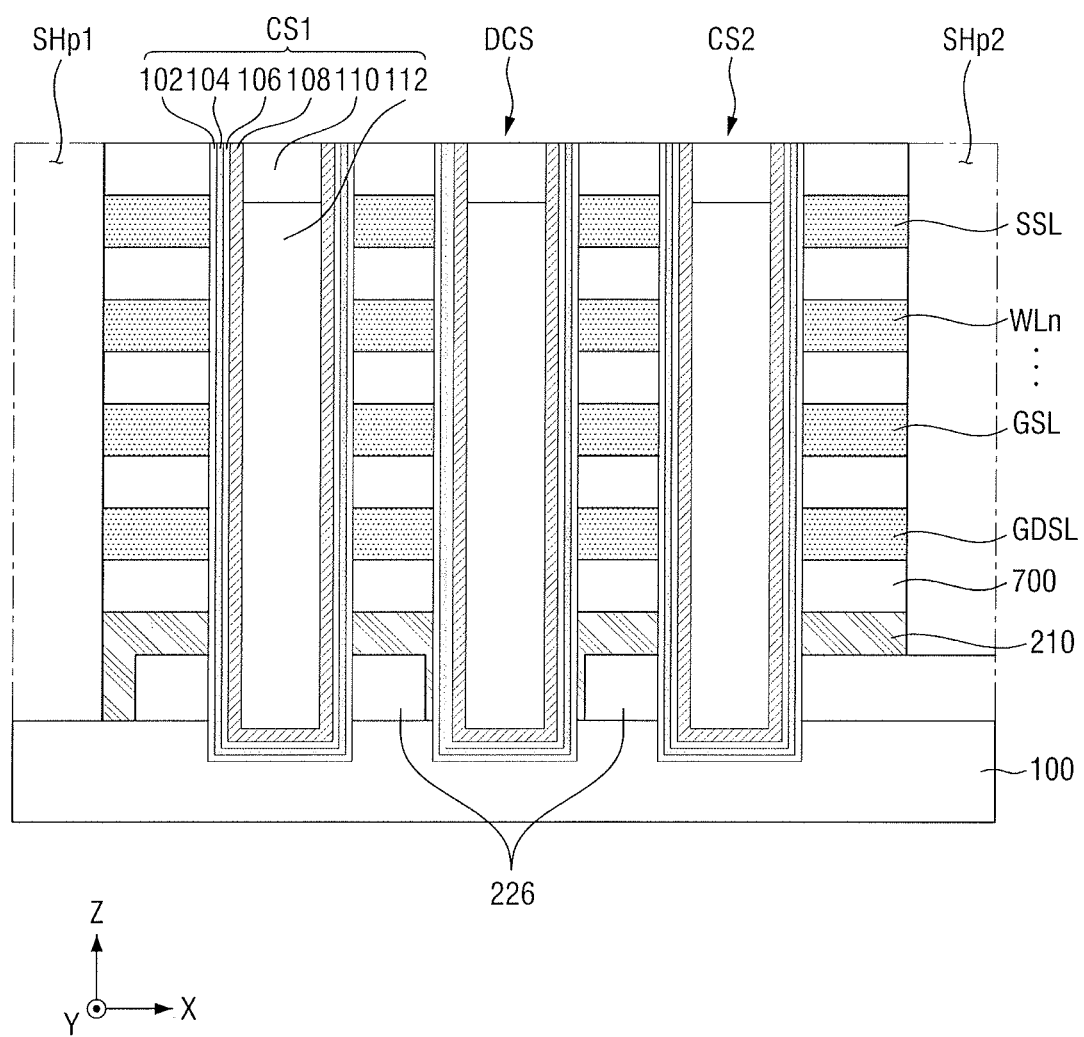

Referring to FIGS. 11 and 12, a diffusion prevention film may be formed conformally in the first recesses RC1 between the first sacrificial films 700. The diffusion prevention film may be formed by CVD or ALD. The diffusion prevention film may include, e.g., a nitride such as silicon nitride (SiN), silicon oxynitride (SiON), or a high-k nitride film. The high-k nitride film may include, e.g., aluminum silicon oxide nitride (AlSiON), aluminum oxide nitride (AlON), HfSiON, or HfON. In an implementation, the diffusion prevention film may include a material having a low etching selectivity with respect to hydrogen fluoride (HF) gas. The conductive films (GDSL, GSL, WL0 through WLn, and SSL) may be formed on the diffusion prevention film.

The conductive films (GDSL, GSL, WL0 through WLn, and SSL) may include a conductive material. In an implementation, the conductive films (GDSL, GSL, WL0 through WLn, and SSL) may include, e.g., a metal such as W, Co, or Ni, or a semiconductor material such as Si.

Figure 13:
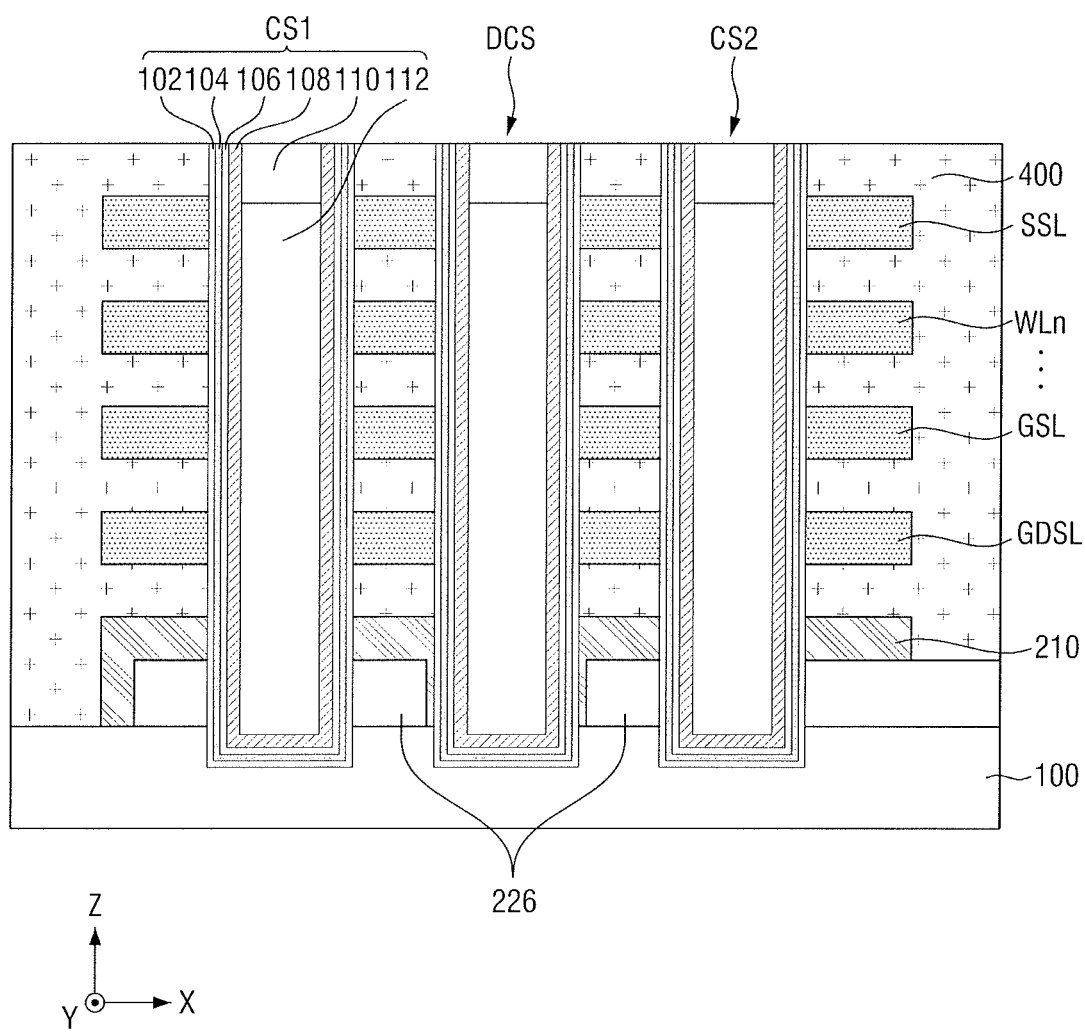

Referring to FIGS. 12 and 13, recesses may be formed in portions of the first sacrificial films 700 that are exposed by the first and second preliminary isolation holes SHp1 and SHp2, by performing an etch-back process on the first sacrificial films 700, and then, an interlayer insulating film 400 may be deposited. The interlayer insulating film 400 may be formed by CVD or ALD.

The interlayer insulating film 400 may include an insulating material. In an implementation, the interlayer insulating film 400 may include, e.g., a silicon oxide such as BSG, PSG, BPSG, USG, TEOS, or HDP-CVD silicon oxide.

Figure 14:
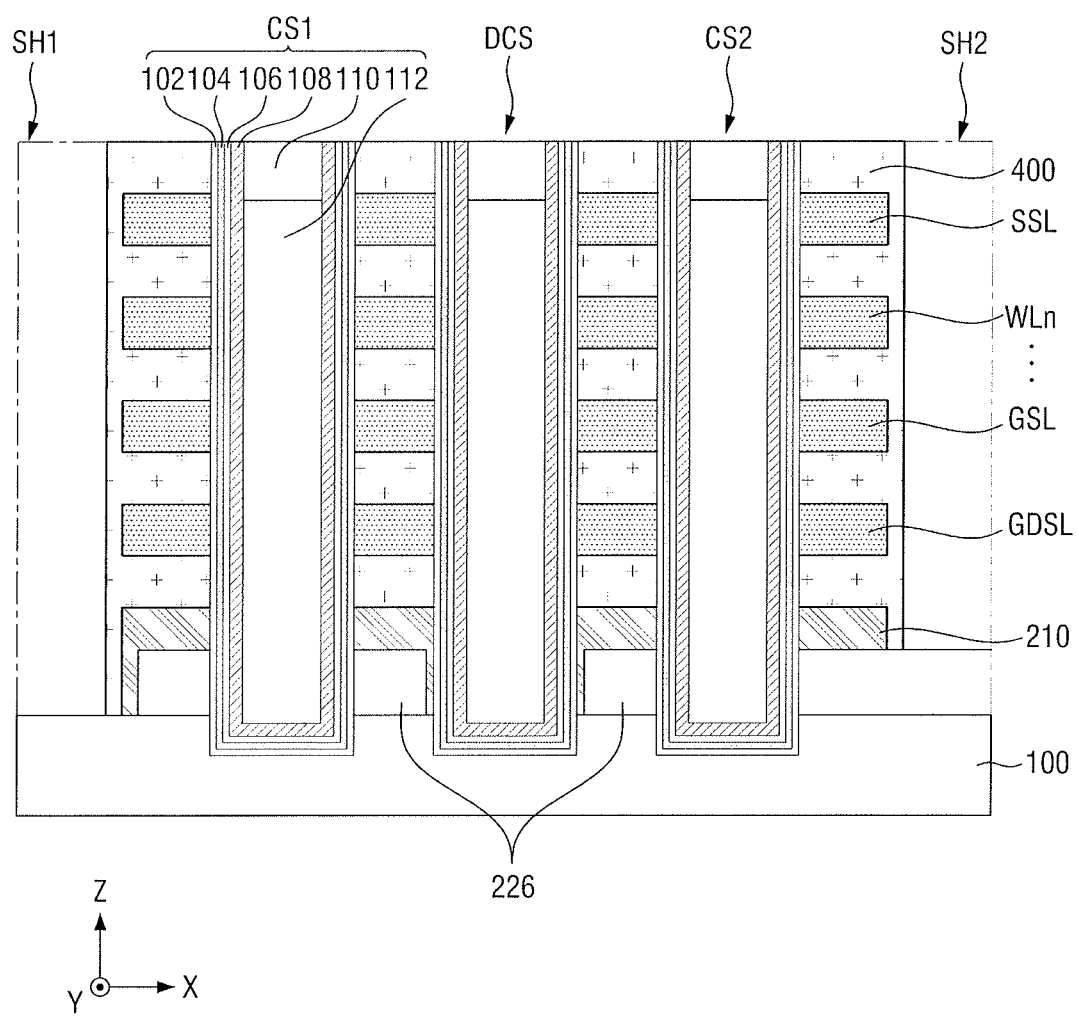

Referring to FIG. 14, part of the interlayer insulating film 400 adjacent to the first channel structure CS1 may be removed to form a first isolation trench SH1 that exposes the top surface of the substrate 100, and part of the interlayer insulating film 400 adjacent to the second channel structure CS2 may be removed to form a second isolation trench SH2 that exposes the top surface of the sealing layer sacrificial film 226.

Figure 15:
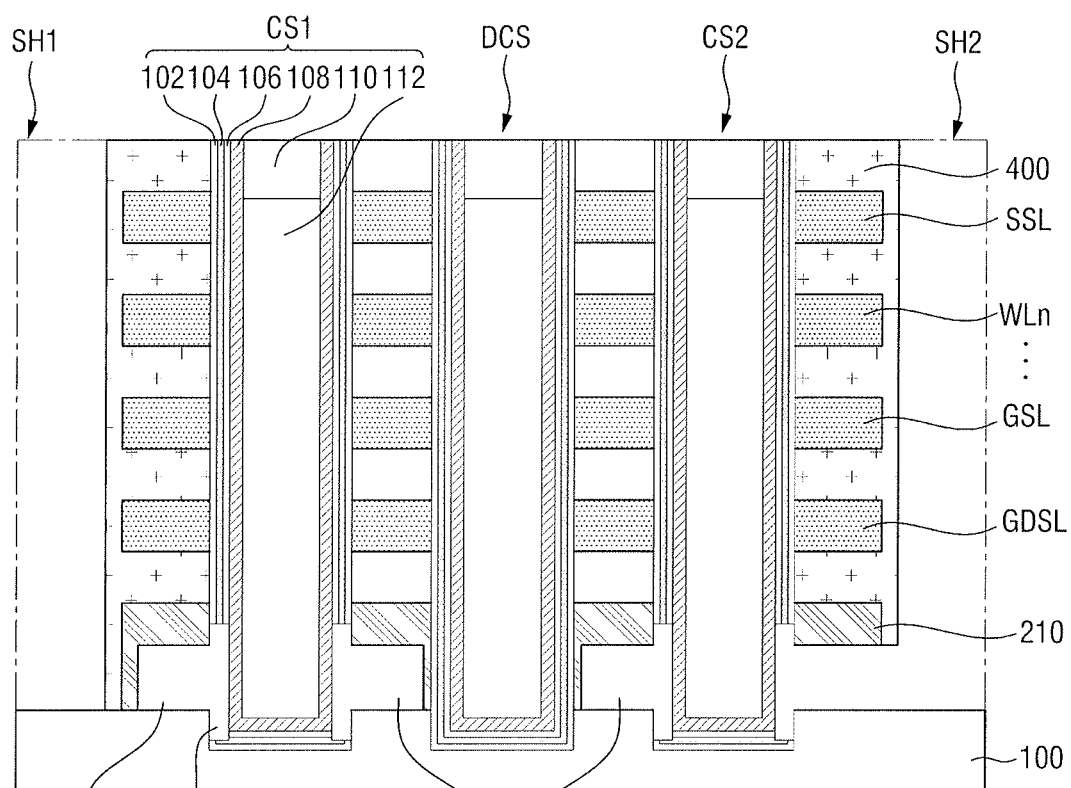

Thereafter, referring to FIGS. 3 and 15, the sealing layer sacrificial film 226 may be removed. The sealing layer sacrificial film 226 may be removed using the second isolation trench SH2 and using a pullback process. For example, the sealing layer sacrificial film 226 may include a material having etching selectivity with respect to other materials. Thereafter, the second poly liner 306 may be injected into sealing layer contact regions 228 that are exposed by the removal of the sealing layer sacrificial film 226 and into the second isolation trench SH2, the first poly liner 302 may be injected into the first isolation trench SH1, the first sub-poly liner 304 may be injected into the first isolation trench SH1, and the second sub-poly liner 308 may be injected into the second isolation trench SH2, thereby obtaining the semiconductor device of FIG. 3.

For example, the second poly liner 306 may be formed on the sidewalls of the second isolation trench SH2, and at the same time, the second poly liner 306 may be injected into the sealing layer contact regions 228. In this manner, defects that may be generated in a lower structure 230, which includes a sealing layer 220 and a support layer 210, when forming the second isolation trench SH2 by etching the lower structure 230, may be reduced. Also, any increases in resistance that may be caused by defects in the substrate 100 when forming the second isolation trench SH2 by etching the lower structure 230, may be prevented.

Accordingly, the sealing layer 220 may transmit a current to, or receive a current from, the second poly liner 306 of the second isolation trench SH2 through low resistance and through the butting layer 224, which is formed in the second channel structure CS2, and the sub-butting layer 222, which is connected to the butting layer 224. The sealing layer 220 may be formed through the formation of the sidewall profile of the second isolation trench SH2, any defects that may be generated, e.g., in the substrate 100, when etching the sealing layer 220 may be reduced.

By way of summation and review, the integration density of the nonvolatile memory device may increase to meet user demands such as excellent performance and low price. The integration density of a two-dimensional (2D) or flat memory device may be determined by the area occupied by each unit memory cell. For example, a three-dimensional (3D) memory device in which unit memory cells are vertically arranged has been considered.

One or more embodiments may provide a semiconductor device having a sealing layer and an isolation trench that include the same material.

One or more embodiments may provide a semiconductor device having an isolation trench and a sealing layer that include the same material and thereby having an improved reliability.

One or more embodiments may provide a method of fabricating a semiconductor device having an isolation trench and a sealing layer that include the same material and thereby having an improved reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate;
a lower structure including a sealing layer in contact with the substrate and a support layer on the sealing layer, the sealing layer and the support layer both including a semiconductor material;
a mold structure on the lower structure and having an interlayer insulating film and a conductive film alternately stacked therein;
a channel hole penetrating the mold structure and the lower structure;
a channel structure extending along sidewalls of the channel hole;
an isolation trench penetrating the mold structure and extending to and defined by the top surface of the substrate; and
a poly liner extending along and covering sidewalls of the isolation trench, the poly liner being connected to the substrate and including the semiconductor material.

2. The semiconductor device as claimed in claim 1, further comprising a penetration formed to penetrate part of the channel structure, wherein the penetration includes the poly liner.

3. The semiconductor device as claimed in claim 1, wherein the substrate includes the semiconductor material.

4. The semiconductor device as claimed in claim 1, further comprising a peripheral circuit region having peripheral circuits on the substrate, wherein:
the lower structure and the mold structure are sequentially stacked on a first surface of the substrate, and
the peripheral circuit region is formed on a second surface of the substrate that is opposite to the first surface of the substrate.

5. The semiconductor device as claimed in claim 4, wherein the isolation trench is in an insulating material.

6. The semiconductor device as claimed in claim 4, wherein:
the substrate includes a high-concentration doped region which is doped with the semiconductor material to a high concentration, and
a part of a top surface of the high-concentration doped region contacts the poly liner.

7. The semiconductor device as claimed in claim 1, further comprising a sub-poly liner in the isolation trench, the sub-poly liner including the semiconductor material.

8. The semiconductor device as claimed in claim 1, wherein the sealing layer and the support layer include the same semiconductor material.

* * * * *